United States Patent [19]

Smith et al.

[11] Patent Number: 5,358,597

[45] Date of Patent: Oct. 25, 1994

[54] METHOD OF PROTECTING ALUMINUM NITRIDE CIRCUIT SUBSTRATES DURING ELECTROLESS PLATING USING SOL-GEL OXIDE FILMS AND ARTICLE MADE THEREFROM

[75] Inventors: Sandra L. Smith, Georgetown; Brian J. Hazen, Framingham, both of Mass.

[73] Assignee: GTE Laboratories Incorporated, Waltham, Mass.

[21] Appl. No.: 103,997

[22] Filed: Aug. 10, 1993

Related U.S. Application Data

[63] Continuation of Ser. No. 754,882, Sep. 4, 1991, abandoned.

[51] Int. Cl.$^5$ ............................................. C23C 26/00
[52] U.S. Cl. .................................... 156/625; 427/304; 427/305; 427/309; 427/405; 427/437; 427/443.1; 427/383.7
[58] Field of Search ............... 427/304, 305, 306, 309, 427/405, 437, 443.1, 226, 255, 383.7; 156/625

[56] References Cited

U.S. PATENT DOCUMENTS

| | | | |
|---|---|---|---|
| 4,886,766 | 12/1989 | Dwivedi | 264/65 |
| 4,964,923 | 10/1990 | Takeuchi | 427/96 |
| 5,058,799 | 10/1991 | Zsamboky | 427/376.7 |
| 5,082,163 | 1/1992 | Kanahara | 228/198 |
| 5,082,700 | 1/1992 | Dwivedi | 138/114 |
| 5,100,714 | 3/1992 | Zsamboky | 428/632 |

Primary Examiner—Shrive Beck
Assistant Examiner—Vi Duong Dang
Attorney, Agent, or Firm—Carl F. Ruoff; Elizabeth A. Levy; Robert F. Clark

[57] ABSTRACT

The present invention describes a process for protecting aluminum nitride circuit substrates during electroless plating using a sol-gel technique. The aluminum nitride substrate is coated with a metal. The coated substrate is etched to form a circuit pattern thereby exposing the aluminum nitride. The etched substrate is placed in a solution of tetraethylorthosilicate and withdrawn. The substrate is dried in air and then baked in an oven to remove all of the organic solvents leaving a stoichiometric film of silica on the exposed substrate. The substrate is then placed in an electroless plating solution and the circuit pattern is plated to a predetermined thickness.

4 Claims, No Drawings

METHOD OF PROTECTING ALUMINUM NITRIDE CIRCUIT SUBSTRATES DURING ELECTROLESS PLATING USING SOL-GEL OXIDE FILMS AND ARTICLE MADE THEREFROM

This is a continuation of copending application Ser. No. 07/754,882, filed on Sep. 4, 1991, now abandoned.

BACKGROUND OF THE INVENTION

The present invention discloses a method of plating aluminum nitride with electroless plating solutions while protecting the aluminum nitride from the electroless solution.

Materials with high thermal conductivity and low dielectric constant are required for high speed and high power microwave hybrid circuits. Aluminum Nitride (AlN) meets these standards and provides additional benefits as well. Alumina and beryllia are typical substrates used in microwave applications but are gradually being replaced by other substrates. One of the major concerns in the processing of circuits on AlN, is AlN's extreme susceptibility to alkaline solutions. This presents a problem not only while cleaning the substrate but also during various metal etching and plating processes.

Aluminum nitride is an exceptionally difficult material to plate using electroless techniques. Most electroless gold plating solutions have a very high pH, usually 14, and aluminum nitride is very susceptible to solutions with even a mildly high pH. It has been observed that even deionized water, with an average pH of 8.2, can have detrimental effects on the aluminum nitride. The effect of an alkaline solution on aluminum nitride is an actual etching of the surface. Exposed to a detergent solution for only seconds, the surface of AlN may be altered enough to substantially reduce the adhesion of thin and thick film metals.

Aluminum nitride substrates were placed in sodium hydroxide solutions having a pH of 14 and the etch rate was calculated. The control, aluminum oxide, had an etch rate of 0.00% while that of aluminum nitride had an etch rate of between 3.16 and 4.10% by weight per hour depending on the concentration of the solution. This is an unacceptable rate of deterioration for any circuit application and will inevitably cause severe problems in future processing of the circuit.

Problems which arise because of this substrate etching effect are three fold. First, the plated pattern deposited by the electroless solution will have very poor adhesion, often to the extreme that the edges of pad areas and transmission lines will peel off during rinsing. Second, the solution may readily become contaminated by the disassociated AlN. Electroless plating solutions are extremely sensitive to all types of contamination. A buildup of aluminum in the plating bath will very quickly inactivate the solution as well as contaminate substrates being plated. The third problem is that of determining the thickness of the plated films. Typically, the thickness of plated metals is determined by a weight gain calculation. A substrate is weighed before and after plating and a calculation involving the density of plated gold can yield a very accurate value for gold thickness. This method, however, is inconclusive using aluminum nitride. When plating electroless gold onto a metal circuit pattern on aluminum nitride, the etch rate of the substrate far exceeds the deposition rate of the gold. The net effect is a decrease in overall weight of the substrate. Another means of measuring thickness is a stylus profilometer. In this process, a stylus is dragged across the surface of the substrate and differences in height are physically measured. For aluminum nitride, a stylus profilometer cannot be used to measure the thickness step since the measurement will be taken from the bottom of the etched substrate to the surface of the plated gold on the unetched areas, therefore, showing an artificially high thickness of gold. Because of the variations in density for plated gold, x-ray fluorescence is also not an accurate means of determining film thickness.

The etching of aluminum nitride is only a problem during plating when a conductor pattern has previously been etched, thereby leaving exposed ceramic material (i.e. AlN) in the plating solution. One option, which is not always available, is to plate up gold onto a completely metallized substrate and then pattern and etch the circuit. This process does not allow for very fine line definition or control of side wall profiles compared to pre-patterned plating. In addition, this method is very costly and inefficient.

The present invention overcomes these obstacles in a novel manner and thereby allows the use of aluminum nitride as a substrate for microwave circuits.

SUMMARY OF THE INVENTION

The present invention describes a novel technique for forming a microwave circuit using aluminum nitride as the supporting substrate. The aluminum nitride substrate is coated with a metal stack such as gold, nickel and a titanium-tungsten alloy. The coated substrate is patterned and etched exposing a circuit on aluminum nitride. After etching the substrate is dipped in a solution of tetraethylorthosilicate and dried. The substrate is heated to remove the solvents leaving a stoichiometric layer of silica ($SiO_2$) on the exposed aluminum nitride. The metal pattern is then electrolessly plated forming a microwave circuit which is ready for die attach, wire bonding and other assembly.

DETAILED DESCRIPTION OF THE PREFERRED EMBODIMENTS

Electroless plating is a desirable process for the plating of circuit boards with numerous pad areas and conductor lines. To plate conductive patterns on aluminum nitride substrates in an electroless plating solution, specifically gold, as it is a common conductor metal for microwave applications, one must first protect the exposed substrate areas. The present invention provides a method of treating the exposed aluminum nitride substrate so that subsequent contact with electroless plating solutions does not cause substrate deterioration. In the method which is the subject of this invention, the substrate is submerged in a specifically designed sol-gel solution. By employing this invention, a sol-gel immersion technique, a patterned substrate is dipped into an organic solvent-based solution and upon hydrolysis in air, a thin stoichiometric dielectric film is formed on the substrate. The sol-gel solution is specifically chosen to adhere to the AlN. Because of the difference in surface tensions of the thin film metal (e.g. gold) and the AlN, the sol-gel solution adheres to the AlN and only in insignificant amounts to the conductive metal areas, thereby not interfering with the subsequent plating process. AlN substrates with this dielectric coating have reduced susceptibility in the electroless gold plating solution by as much as 97% thus making the electroless plating procedure a viable one.

As a test of the effectiveness of this invention, two aluminum nitride substrates were coated with thin films of a titanium-tungsten alloy, nickel and gold. A circuit was patterned and etched leaving exposed areas of aluminum nitride. One patterned substrate was coated with silicon dioxide using a sol-gel method by dipping it into and withdrawing it from a solution of tetraethylorthosilicate. Other solutions may also be used to deposit various dielectric layers such as tetraethylorthotitanate to deposit titania ($TiO_2$). The concentrated TEOS solution is diluted depending on the desired film thickness. For this application, a 40% TEOS solution was used with 60% ethanol. After 10 minutes of air drying, the coated substrate was baked for 10 minutes at 100° C. then for 10 minutes at 600° C. This firing sequence removed all the organic solvents from the coating leaving a film of silicon dioxide ($SiO_2$). Both the coated and uncoated substrates were then placed in a solution of 1M sodium hydroxide for 60 minutes. The results were as follows. The uncoated aluminum nitride substrate showed a decrease of 3.1% by weight. AlN coated with one layer of $SiO_2$ had a weight reduction of only 0.13%. This represents an 88% improvement due to the coating on the substrate. Further investigations show that applying two thin coatings of $SiO_2$ to the exposed substrate improves resistance of the aluminum nitride by 97% without interfering with the plating procedure. The second coating of oxide covers any pinholes and imperfections in the first thin film providing a better protective film over the AlN. Concerns using this protection process were the possible negative effects of the drying and firing on the existing thin films and the possibility of the film interfering with the plating process. To test this, coated substrates and uncoated control substrates were electrolessly plated and weighed. These substrates were first placed into an immersion gold solution for 15 minutes to apply a seed layer of gold onto the titanium-tungsten alloy and nickel side walls. Coated and uncoated aluminum nitride substrates were then electrolessly gold plated for one hour. The two substrates were compared. The uncoated aluminum nitride showed a decrease in overall weight after plating whereas the substrate coated with silica showed a net increase in weight. This not only implies that the substrate is not etching as quickly as the uncoated control but also shows that the coating does not prohibit the gold plating process from occurring.

While there has been shown and described what is at present considered the preferred embodiment of the invention, it will be obvious to those skilled in the art that various alterations and modifications may be made therein without departing from the scope of the invention.

What is claimed is:

1. A method for forming a microwave circuit on an aluminum nitride substrate comprising the steps of:
   coating said substrate with a metal stack to form a coated substrate;
   etching said coated substrate to form a pattern of said metal stack and exposed surfaces of said coated substrate;
   covering said exposed surfaces of said coated substrate with a dielectric coating; and
   electrolessly gold plating said metal stack pattern by dipping said coated substrate into an alkaline electroless gold plating bath.

2. The method according to claim 1 wherein said alkaline electroless gold plating bath is at a pH of 12.0 or greater.

3. The method of forming a microwave circuit according to claim 1 wherein said exposed surfaces of said coated substrate are covered with said dielectric coating by dipping said coated substrate into a solution selected from the group consisting of tetraethylorthosilicate and tetraethylorthotitanate; removing said coated substrate from said solution and drying in air; and heating said coated substrate at a time and temperature sufficient to remove the remainder of said solution.

4. A method for forming a microwave circuit on an aluminum nitride substrate comprising the steps of:
   coating said substrate with a metal stack to form a coated substrate;
   etching said coated substrate to form a pattern of said metal stack and exposed surfaces of said coated substrate;
   covering said exposed surfaces of said coated substrate with a dielectric coating by dipping said coated substrate into a solution selected from the group consisting of tetraethylorthosilicate and tetraethylorthotitanate;
   electrolessly gold plating said metal stack pattern by dipping said coated substrate into an alkaline electroless gold plating bath;
   removing said coated substrate from said solution and drying in air; and
   heating said coated substrate for 10 minutes at 100° C. and then for 10 minutes at 600° C.

* * * * *